United States Patent [19]
Owen et al.

[11] Patent Number: 5,602,392
[45] Date of Patent: Feb. 11, 1997

[54] THERMAL CROSSTALK REDUCTION FOR INFRARED DETECTORS WITH COMMON ELECTRODES

[75] Inventors: Robert A. Owen, Rowlett; William K. Walker, Plano; Steven E. Frank, McKinney; Charles M. Hanson, Richardson; Kevin N. Sweetser, Garland; Edward G. Meissner, Dallas; Howard R. Beratan, Richardson, all of Tex.

[73] Assignee: Texas Instruments, Dallas, Tex.

[21] Appl. No.: 476,409

[22] Filed: Jun. 7, 1995

Related U.S. Application Data

[62] Division of Ser. No. 381,676, Jan. 31, 1995.

[51] Int. Cl.[6] .................................................. H01L 27/146
[52] U.S. Cl. .................... 250/338.3; 250/332; 250/338.2
[58] Field of Search .............................. 250/338.3, 338.2, 250/332

[56] References Cited

U.S. PATENT DOCUMENTS

| | | | |
|---|---|---|---|
| 4,080,532 | 3/1978 | Hopper | 250/332 |
| 4,740,700 | 4/1988 | Shaham et al. | 250/332 |
| 4,745,278 | 5/1988 | Hanson | 250/338.2 |
| 4,792,681 | 12/1988 | Hanson | 250/338.2 |
| 4,945,240 | 7/1990 | Nix et al. | 250/330 |
| 5,047,644 | 9/1991 | Meissner et al. | 250/332 |
| 5,077,474 | 12/1991 | Nix et al. | 250/332 |
| 5,426,303 | 6/1995 | Owen et al. | 250/332 |

OTHER PUBLICATIONS

Hanson, et al "Low–cost Uncooled Focal Plane Array Technology" Presented at Detector IRIS Meeting, Bedford, MA: By Defense Systems and Electronics Group; Aug. 17, 1993, pp. 1–9.

*Primary Examiner*—Constantine Hannaher
*Attorney, Agent, or Firm*—Kay Houston; William W. Brady; Richard L. Donaldson

[57] ABSTRACT

A hybrid thermal detector and method for producing same where the optical coating 32 of the hybrid thermal detector has elongated parallel thermal isolation stots 62 along one axis. The elongated parallel slots 62 improve the acuity, or MTF of the resultant image produced by the detector along one axis. The optical coating 32 may be corrugated, or elevated, in order to add structural support and allow mechanical compliance along the axis of the slots.

14 Claims, 3 Drawing Sheets

THERMAL CROSSTALK REDUCTION FOR INFRARED DETECTORS WITH COMMON ELECTRODES

This is a divisional of application Ser. No. 08/381,676 filed Jan. 31, 1995.

CROSS-REFERENCE TO RELATED APPLICATIONS

The following U.S. patent applications are commonly assigned and are hereby incorporated herein by reference:

| TI Case | Ser. No. | Filing Date | Inventor | Title |
| --- | --- | --- | --- | --- |
| TI-18788 (U.S. Pat. No. 5,426,304) | 08/182,865 | 1/13/94 | Belcher et al. | Infrared Detector and Method |
| TI-17233 (U.S. Pat. No. 5,436,450) | 08/182,268 | 1/13/94 | Belcher et al. | Infrared Detector and Method |
| TI-18636 (U.S. Pat. No. 5,424,544) | 08/235,835 | 4/29/94 | Shelton et al. | Inter-Pixel Thermal Isolation for Hybrid Thermal Detectors |
| TI-18727 | 08/223,088 | 4/4/94 | Belcher et al. | Dual Etching of Ceramic Materials with an Elevated Thin Film |
| TI-18736 | 08/222,769 | 4/4/94 | Belcher et al. | Dual Etching of Ceramic Materials with a Thin Front Film |
| TI-18737 (U.S. Pat. No. 5,466,331) | 08/222,144 | 4/4/94 | Belcher | An Elevated Thin Film for Ceramic Materials |
| TI-18726 | 08/223,073 | 4/4/94 | Belcher et al. | Etching of Ceramic Materials with an Elevated Thin Film |

The following U.S. patent application filed concurrently herewith the patent application for the present invention, is also incorporated herein by reference:

| TI Case | Ser. No. | Inventor | Title |
| --- | --- | --- | --- |
| TI 19299 | 08/381,677 | Belcher et al. | Optical Coat Reticulation Post Hybridization |

FIELD OF THE INVENTION

This invention generally relates to infrared or thermal imaging systems, and more specifically to inter-pixel thermal isolation in a thermal (infrared) detector array.

BACKGROUND OF THE INVENTION

Infrared or thermal imaging systems typically use thermal sensors to detect infrared radiation and produce an image capable of being visualized by the human eye. Some examples of such thermal imaging devices include night vision equipment and law enforcement surveillance equipment.

Several prior art references disclose infrared imaging arrays and methods for producing such arrays. U.S. Pat. No. 4,080,532 issued to Hopper; and U.S. Pat. Nos. 4,745,278 and 4,792,681 issued to Hanson utilize ferroelectric materials for infrared detection. Thermal imaging by means of uncooled sensors is described in a paper entitled *Low-cost Uncooled Focal Plane Array Technology* written by Hanson, Beratan, Owen and Sweetser presented Aug. 17, 1993 at the IRIS Detector Specialty Review.

SUMMARY OF THE INVENTION

In accordance with the present invention, the disadvantages and problems associated with thermal coupling between adjoining thermal sensors of an infrared sensing array have been reduced. The present invention improves inter-pixel thermal isolation by selectively patterning elongated parallel slots in the optical coating and any underlying common electrode along one axis of the array. As will be discussed, there are advantages to orienting these isolation slots in a specific direction where improved resolution is desired.

One embodiment of the present invention is a hybrid thermal detector including a focal plane array mounted with a thermal isolation structure on an integrated circuit substrate. comprising at least three thermal sensors in the focal plane array, each for providing a sensor signal output representative of thermal radiation incident to the focal plane array, where the fiscal plane array has two axes. An optical coating is coupled to the thermal sensors and the optical coating has elongated parallel slots intermediate the thermal sensors along one axis. The elongated parallel slots are configured so that an electrically-conducting layer of the optical coating provides an electrical connection to the thermal sensors. The optical coating may be corrugated in one direction to allow mechanical compliance and strengthen the optical coating. The elongated parallel slots may be formed prior to mounting the focal plane array to the integrated circuit substrate.

Another embodiment of the present invention is a method for fabricating a hybrid thermal detector including a focal plane array mounted with a thermal isolation structure on an integrated circuit substrate, comprising the steps of forming at least three thermal sensors in the focal plane array, each for providing a sensor signal output representative of thermal radiation incident to the focal plane array, where the focal plane array has two axes. An optical coating is formed coupled to the thermal sensors, where the optical coating has elongated parallel slots intermediate the thermal sensors along one axis. The elongated parallel slots are configured so that the electrically-conducting coat of the optical coating provides an electrical connection to the thermal sensors. The optical coating may be corrugated in one direction to provide mechanical compliance and strengthen the optical coating. The elongated parallel slots may be formed either before or after mounting the focal plane array to the integrated circuit substrate.

Advantages of the invention include improved image acuity or MTF (Modulation Transfer Function) of the hybrid thermal detector along one axis. The corrugated optical coating provides improved mechanical support and compliance, decreasing the occurrence of pixels separating from the optical coating. Reticulating the optical coating after bonding the focal plane array to the integrated circuit structure reduces manufacturing defects, as described in commonly assigned and related U.S. patent application, Ser. No. 08/381,677 (TI case No. TI-19299) entitled *Optical Coat Reticulation Post Hybridization*, filed concurrently herewith.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

Figure 1:
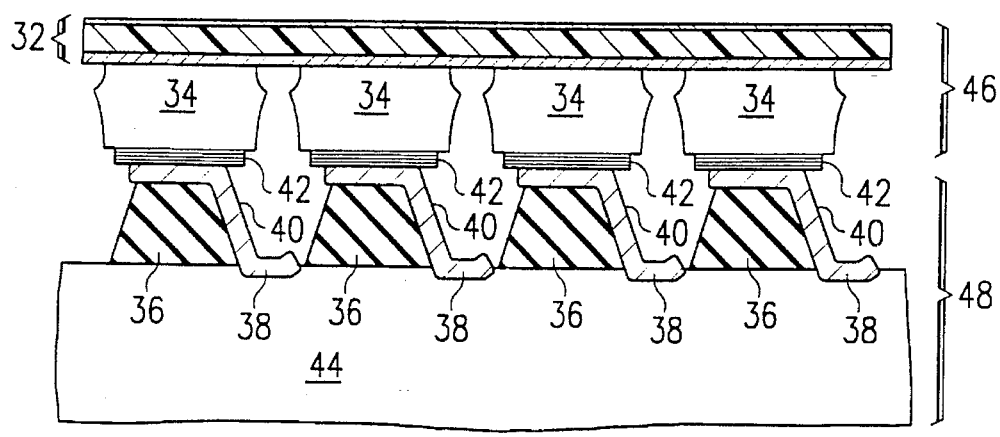
FIG. 1 shows a prior art drawing of cross-sectional elevational view of a hybrid structure including a planar infrared sensing array electrically and physically bonded to thermally isolating mesas on a sensing integrated circuit.

The drawings are neither to absolute nor relative scale. Thin film thicknesses have been exaggerated for clarity in description.

DETAILED DESCRIPTION OF THE PREFERRED EMBODIMENTS

Thermal imaging systems described in prior art references utilize an array of ferroelectric or bolometric sensors to detect thermal images which may then be convened into a TV image. Each pixel in these arrays comprises a capacitor having a temperature-sensitive charge. Electronic circuitry may be attached to the two terminals of the pixel capacitor to measure the intensity of the infrared radiation impinging on a specific pixel. Electronic connections to these capacitors are simplified if one of these capacitor terminals is common to all. From hundreds to tens of thousands of connections are made between the other isolated terminals of the capacitors and the integrated circuit used for electronic sensing. In addition, the pixel capacitors are thermally isolated from each other while having one terminal electrically connected to all the other common terminals.

The common connection, or common electrode, to one side of the pixel capacitors may be part of an optical coating comprised of a plurality of thin films having the desired physical properties, such as infrared transparency, electrical conductivity, and thermal conductivity, for example. The thickest layer of the optical coating may be a heat-sensitive dielectric substrate made of a pyroelectric material, for example, barium-strontium-titanate (BST). The electrical polarization and capacitance of a pyroelectric material such as BST changes in response to temperature.

Typically, an infrared absorber and common electrode assembly are disposed on one side of the pyroelectric element and comprise an optical coating disposed over a common electrode. A sensor signal electrode may be disposed on the opposite side of each pyroelectric element. The infrared absorber and common electrode assembly typically extend across the surface of the focal plane array and electrically couple the bias voltage to each pyroelectric element through the common electrode. Each infrared detector element or thermal sensor is defined, in part, by a portion of the infrared absorber and a common electrode assembly and a respective sensor signal electrode, which constitute capacitive plates, and a pyroelectric element, which constitutes a dielectric or insulator disposed between the capacitive plates.

To maximize thermal response and enhance thermal image accuracy, each pyroelectric element of a focal plane array is preferably isolated thermally from adjoining pyroelectric elements so that the sensor signal accurately represents incident infrared radiation associated with each thermal sensor. Thermal isolation between thermal sensors, known as inter-pixel thermal isolation improves the accuracy and quality of the resulting thermal image. Several approaches have been used to improve inter-pixel thermal isolation in a focal plane array. Unfortunately, the optical coating which provides absorption of the infrared energy also forms a thermal path between pixels, producing thermal crosstalk which may degrade the focus of the resultant image produced. Improving thermal isolation between pixel capacitors by patterning slots in the horizontal and vertical directions of the optical coating while leaving the common electrode intact is described in commonly assigned and related U.S. patent application *Inter-Pixel Thermal Isolation for Hybrid Thermal Detectors*, Ser. No. 08/235,835 filed Apr. 29, 1994 (U.S. Pat. No. 5,424,544). U.S. patent application, Ser. No. 08/381,677 (TI case No. TI-19299) entitled *Optical Coat Reticulation Post Hybridization*, filed concurrently herewith, describes a novel method of patterning these slots without breakage.

When an observer looks at the image of a scene reproduced by an infrared camera, there is typically a preference for high resolution in the horizontal direction, a preference that was well established before the marketing of consumer television. However, when infrared images are used to implement computer controls such as manufacturing operations or unattended monitoring systems, it is often preferred that the highest resolution be in the vertical direction of the image. For example, if the infrared camera is observing a vertically calibrated instrument such as a thermometer, barometer or liquid level gauge, then the highest resolution is preferred in the vertical direction. With the present invention, it has been found that resolution improvement may be sacrificed in one direction on an infrared imaging system to achieve high resolution in the other by thermally isolating pixels along one axis with elongated parallel slots formed in the optical coating.

The making and use of the presently preferred embodiments are discussed below in detail. However, it should be appreciated that the present invention provides many applicable inventive concepts which can he embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Generic Term | Preferred or Specific Examples | Other Alternate Examples or Descriptions |
| --- | --- | --- | --- |
| 32 | Optical coating | Multilayered | |
| 34 | Pixel | Barium-strontium-titanate | Ferroelectric; thermally sensitive dielectric; pixel dielectric; pyroelectric |
| 36 | Integrated circuit thermal isolation mesa | Photosensitive polyimide, Dupont 2734 | PMMA (polymethylmethacrylate) |
| 38 | Integrated circuit via for sensing circuit | | |
| 40 | Contact metal | Alloys such as TiW | NiCr |
| 42 | Infrared pixel backside contact | Alloys such as TiW—Au. | 4 layer composite of: In or Pb—Sn solder, 15–60 μm Au 0.5–1.5 μm NiCr 0.5–1.5 μm TiW 0.2–1.0 μm |
| 44 | Integrated circuitry | Silicon technology | GaAs |
| 46 | Infrared sensing array | Optical Coating 32, Pixels 34, Backside contact 42 | |
| 48 | Sensing integrated circuit structure | Mesas 36, contact metal 40, integrated circuitry 44 | |
| 50 | Etch Mask | Photoresist, 4–6 μm thick | Patterned TiW film |
| 52 | Infrared transparent layer of 32. | NiCr (50 Å) | 25–100 Å of NiCr; 100–1000 Å of Cermet or Lanthanum Strontium Cobalt Oxide (LSCO) |
| 54 | ¼ wavelength separator layer of 32. | Parylene (1.4 μm) | ¼ wavelength at desired infrared signal; $ZrO_2$; $SiO_2$ 500–2000 Å thick; cermet; common electrode; LSCO |
| 56 | Electrical conducting layer of 32. | NiCr (1000 Å) | |
| 60 | Bonding eutectic | Indium alloy | Pb—Sn solder |
| 62 | Thermal isolation slots | Width = 1–2 μm | 2–10 μm; Elongated parallel thermal isolation slots |
| 63 | Strips | Portions of optical coating 32 separated by slots 62 | |
| 64 | First axis | e.g. x axis | y axis |
| 66 | Second axis | e.g. y axis | x axis |

Figure 2:
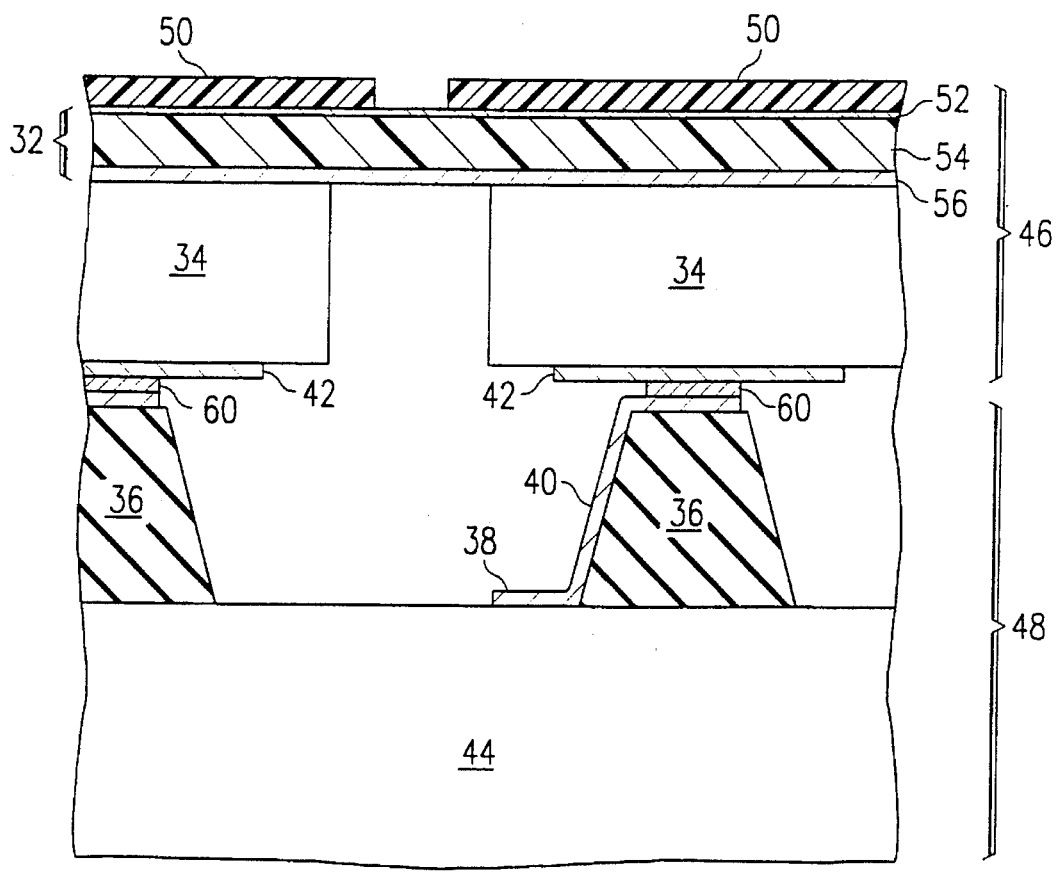
FIG. 2 shows a more detailed cross-sectional elevational view of a portion of the hybrid structure of the invention with photoresist applied for the patterning of thermal isolation slots in the optical coating of the infrared sensing array.
Figure 3:
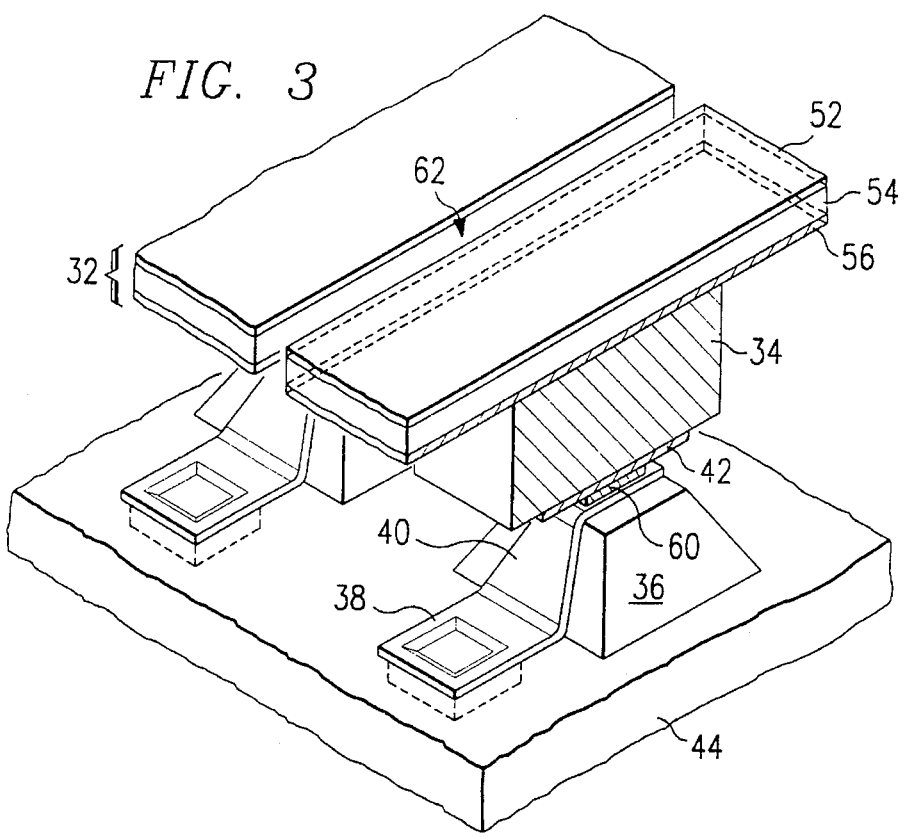
FIG. 3 shows an isometric view of a portion of the hybrid structure after etching of thermal isolation slots along one axis and stripping the photoresist.
Figure 4:
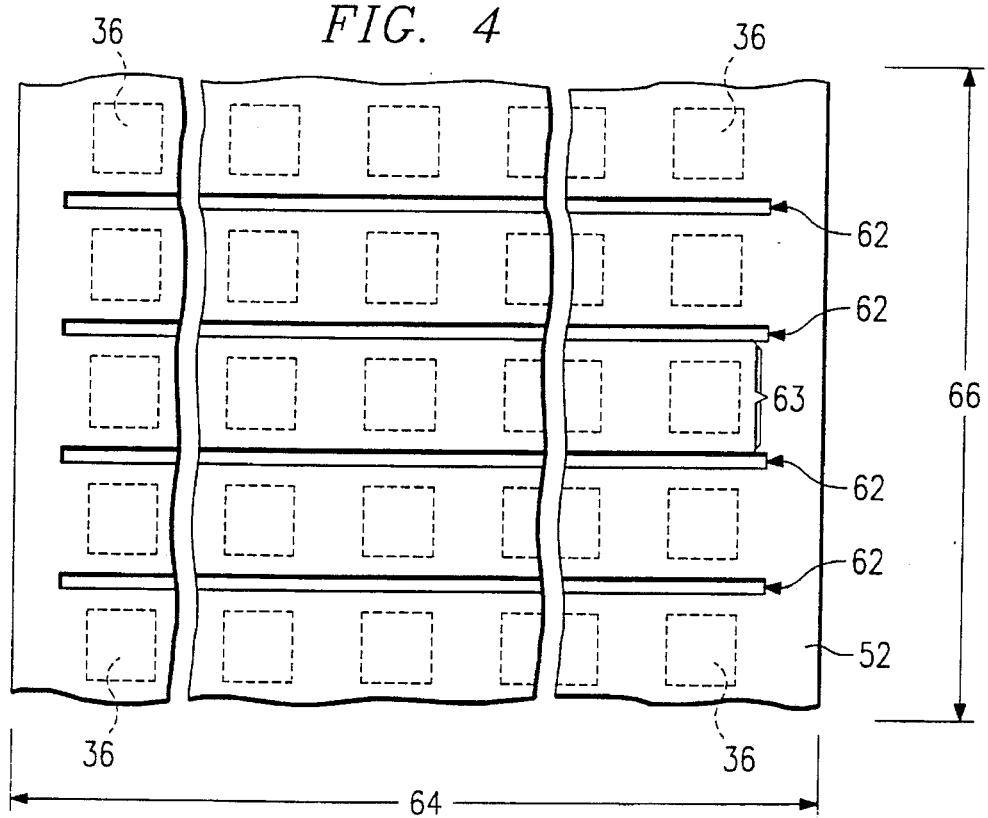
FIG. 4 shows a top view of a focal plane array having a plurality of elongated parallel thermal isolation slots extending most of but not all the distance between two edges of the array.

A first embodiment of the present invention is shown in FIGS. 2–4. FIG. 1 (prior art) shows a hybrid thermal detector comprising an infrared sensing array 46 electrically and physically bonded to a sensing integrated circuit structure 48. Although the pixels 34 have been thermally isolated from their neighbors, thermal crosstalk may still result via thermal conduction within the optical coating 32. To thermally isolate the integrated circuitry 44 from the pixels 34, integrated circuit thermal isolation mesas 36 have been added to the integrated circuit sensing structure 48. The electrical and physical mounting of the infrared sensing array 46 to the integrated circuit sensing structure 48 is achieved by the use of a bonding eutectic 60 (shown in later figures) to adhere the infrared backside pixel contacts 42 with the contact metal 40 through integrated circuit vias 38.

The structure shown in FIG. 1 may be manufactured, for example, by similar techniques described in related U.S. patent application Ser. No. 08/222,769 for Dual Etching of Ceramic Materials With a Thin Front Film filed Apr. 4, 1994 by Belcher et al. and assigned to Texas Instruments, Inc. The infrared sensing array 46 has been bonded to the integrated circuit sensing structure 48.

In FIG. 2. optical coating 32 is shown comprising infrared transparent layer 52, ¼ wavelength separator layer 54 and electrical conducting layer 56. The electrical-conducting layer 56 may comprise, for example, cermet having a metal concentration by weight of seventy percent to ninety percent and a corresponding ceramic concentration by weight of thirty percent to ten percent. An etch mask 50 has been deposited over the optical coating 32 in order to etch thermal isolation slots 62 (shown in later drawings) in optical coating 32. The slob 62 reduce thermal coupling between adjacent pixels 34. The etch mask 50 may be a positive photoresist, which has been patterned by conventional means. Suitable etchants, such as plasma, reactive ion gases or broadcast ion milling, may be used to remove the optical coating 32. The optical coating 32 may also be patterned and attached prior to bonding the infrared sensing array 46 to the integrated circuit sensing structure 48.

FIG. 3 shows an isometric view of the structure after the thermal isolation slots 62 have been etched in the optical coating 32 and the etch mask 50 has been stripped. The thermal isolation slots 62 are preferably 1–2 micrometers (μm) wide and end such that strips 63 of optical coating 32 remain attached at one or both ends as shown in the top view of FIG. 4. Preferably, the strips 63 are attached at both ends, so that detects or cracks in the optical coating 32 along strips 63 have reduced probability for causing the loss of electrical contact with the biasing voltage.

Figure 5:
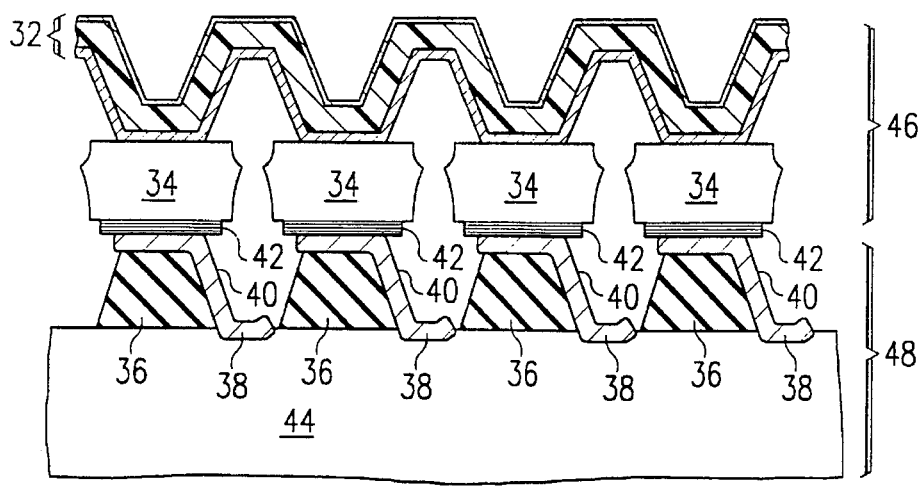
FIG. 5 shows a cross-sectional elevational view of a second embodiment of the present invention, where the multilayer optical coating is corrugated.
Figure 6:
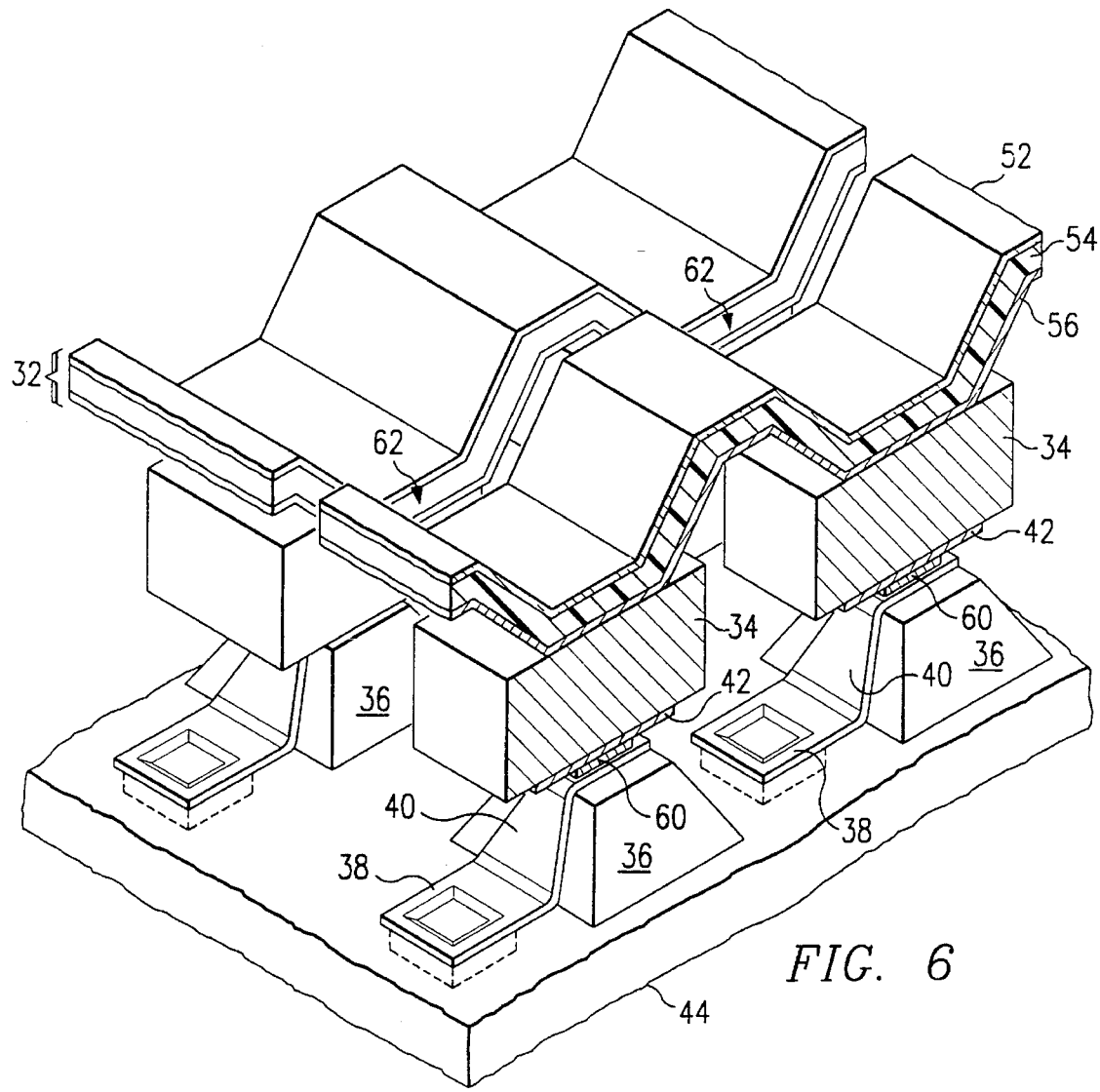
FIG. 6 shows an isometric view of a cross-section of a portion of the hybrid structure after etching of thermal isolation slots in a specific direction and stripping the photoresist, where the multilayer optical coating is corrugated.

A second embodiment is shown in FIGS. 5 and 6. FIG. 5 shows a cross-sectional view of a hybrid thermal detector having a corrugated optical layer 32. The corrugation is produced, for example, as described in U.S. patent application Ser. No. 08/222,144 for An Elevated Thin Film for Ceramic Materials filed Apr. 4, 1994 by Belcher and assigned to Texas Instruments, Inc. (U.S. Pat. No. 5,466,331). A TiW mask may be applied over optical coating 32, a resist pattern may be deposited, and etched. Then elongated parallel thermal isolation slots 62 are formed in the optical coating 32 as shown in FIG. 6 in an isometric view. The slots 62 may be formed on the corrugated optical coating 32, for example, by etching the TiW mask with $CF_4$, and etching the ¼ wavelength separator layer 54 and the infrared transparent layer 52 with an oxygen and argon etch, which also removes the resist. Similar to the first embodiment, the thermal isolation slots 62 are elongated parallel and provide thermal isolation in the optical coating 32

(including the electrically conducting layer 56) between pixels along one axis. The top view remains essentially the same as in the first embodiment, shown in FIG. 4.

Alternates for processes and element materials are appropriate and will be obvious to those skilled in the art. Table 1 indicates various preferred materials and alternates. The thermal isolation slots may be either vertical or horizontal in the image sense. Although shown as perfectly straight lines of constant width, the isolation slots may deviate for structural and strength reasons and may be of varying widths. In some infrared sensing array structures there may be an additional electrically conducting film between the optical coating 32 and the pixels 34 which may be slotted at the same time that the optical coating 32 is slotted.

The novel invention of forming elongated parallel thermal isolation slob in the optical coating of a hybrid thermal detector offers several advantages over conventional thermal isolation means. The elongated parallel slots provide complete thermal isolation (e.g. preventing thermal crosstalk) along one axis, improving the image acuity, or more specifically, the MTF along that axis. Since the strips are preferably attached at both ends, one defect (e.g. 100% of strip width) in the center of a row will allow that row to remain electrically active. The corrugation feature of the invention provides added structural support and allows mechanical compliance along the axis of the slots, decreasing detects.

While the invention has been described with reference to illustrative embodiments, this description is not intended to be construed in a limiting sense. Various modifications and combinations of the illustrative embodiments, as well as other embodiments of the inventions, will be apparent of persons skilled in the art upon reference to the description. It is therefore intended that the appended claims encompass any such modifications or embodiments.

What is claimed is:

1. A hybrid thermal detector including a focal plane array mounted with a thermal isolation structure on an integrated circuit substrate, comprising:

at least three thermal sensors in said focal plane array for providing a sensor signal output representative of thermal radiation incident to said focal plane array, said focal plane array having two axes;

an optical coating coupled to said thermal sensors, said optical coating having elongated parallel slots intermediate said thermal sensors extending along substantially the entire length of said array along one of said axes, said optical coating comprising an electrically-conducting coat, said slots configured so that said electrically-conducting coat of said optical coating provides an electrical connection to said thermal sensors;

wherein said thermal isolation structure is disposed between said focal plane array and said integrated circuit substrate, wherein said thermal isolation structure projects from said integrated circuit substrate for mounting said focal plane array and for coupling the focal plane array to said integrated circuit substrate; and contact pads disposed on said integrated circuit substrate, for receiving a sensor signal output from said thermal sensors through said thermal isolation structure.

2. The hybrid thermal detector of claim 1 wherein each thermal sensor is associated with a pyroelectric element formed from barium strontium titanate and wherein said electrically-conducting coat is coupled to one side of said pyroelectric element and a sensor signal electrode is coupled to the opposite side of said pyroelectric element.

3. The hybrid thermal detector of claim 1 wherein said electrically-conducting coat comprises cermet having a metal concentration by weight of seventy, percent to ninety percent and a corresponding ceramic concentration by weight of thirty percent to ten percent.

4. The hybrid thermal detector of claim 1 wherein said optical coating is multilayered.

5. The hybrid thermal detector of claim 1 wherein said electrically-conducting coat is connected at least at one end.

6. The hybrid thermal detector of claim 5 wherein said electrically-conducting coat is connected at both ends.

7. The hybrid thermal detector of claim 1 wherein said optical coating is corrugated.

8. The hybrid thermal detector of claim 1 wherein said thermal isolation structure is a mesa.

9. A hybrid thermal detector including a focal plane array mounted with a thermal isolation structure on an integrated circuit substrate, comprising:

at least three thermal sensors in said focal plane array for providing a sensor signal output representative of thermal radiation incident to said focal plane array, said focal plane array having two axes;

a multilayer optical coating coupled to said thermal sensors, said optical coating having elongated parallel slots intermediate said thermal sensors extending along substantially the entire length of said array along one of said axes, said optical coating comprising an electrically-conducting coat, said slots configured so that said electrically-conducting coat of said optical coating provides an electrical connection to said thermal sensors;

wherein at least said electrically-conducting coat is connected at least at one end along an axis perpendicular to said elongated parallel slot axis, wherein said thermal isolation structure is disposed between said focal plane array and said integrated circuit substrate, wherein said thermal isolation structure projects from said integrated circuit substrate for mounting said focal plane array and for coupling the focal plane array to said integrated circuit substrate; and contact pads disposed on said integrated circuit substrate, for receiving a sensor signal output from said thermal sensors through said thermal isolation structure.

10. The hybrid thermal detector of claim 9 wherein each thermal sensor is associated with a pyroelectric element formed from barium strontium titanate and wherein said electrically-conducting coat is coupled to one side of said pyroelectric element and a sensor signal electrode is coupled to the opposite side of said pyroelectric element.

11. The hybrid thermal detector of claim 9 wherein said electrically-conducting coat comprises cermet having a metal concentration by weight of seventy percent to ninety percent and a corresponding ceramic concentration by weight of thirty percent to ten percent.

12. The hybrid thermal detector of claim 9 wherein said electrically-conducting coat is connected at both ends.

13. The hybrid thermal detector of claim 9 wherein said optical coating is corrugated.

14. The hybrid thermal detector of claim 9 wherein said thermal isolation structure is a mesa.

* * * * *